US010763457B2

(12) United States Patent
Lee et al.

(10) Patent No.: US 10,763,457 B2
(45) Date of Patent: Sep. 1, 2020

(54) ORGANIC LIGHT-EMITTING DIODE DISPLAY DEVICE

(71) Applicant: LG DISPLAY CO., LTD., Seoul (KR)

(72) Inventors: Sung-Rae Lee, Paju-si (KR); Young-Hun Jeong, Paju-si (KR); Sang-Dae Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/538,524

(22) Filed: Aug. 12, 2019

(65) Prior Publication Data

US 2020/0161586 A1 May 21, 2020

(30) Foreign Application Priority Data

Nov. 19, 2018 (KR) .................. 10-2018-0142532

(51) Int. Cl.
*H01L 29/00* (2006.01)
*H01L 27/00* (2006.01)
*H01L 51/00* (2006.01)
*H01L 51/52* (2006.01)
(Continued)

(52) U.S. Cl.
CPC ........ *H01L 51/5275* (2013.01); *H01L 27/322* (2013.01); *H01L 27/3262* (2013.01); *H01L 51/5281* (2013.01); *H01L 29/7869* (2013.01); *H01L 29/78633* (2013.01); *H01L 29/78675* (2013.01); *H01L 2251/533* (2013.01)

(58) Field of Classification Search
CPC ............. H01L 51/5275; H01L 51/5281; H01L 51/5234; H01L 51/3211; H01L 51/5246; H01L 51/5271; H01L 27/322; H01L 27/3262; H01L 27/3211; H01L 27/3246; H01L 27/3248; H01L 27/5203; H01L 27/156; H01L 29/78633; H01L 29/78675; H01L 29/7869; H01L 2251/533; H01L 2251/5315; H01L 2251/5353
See application file for complete search history.

(56) References Cited

U.S. PATENT DOCUMENTS 4,811,507 A * 3/1989 Blanchet .............. G02B 6/0021
                                                    362/604
6,791,635 B1 * 9/2004 Ohkawa ............... G02B 6/0036
                                                    349/61
(Continued)

FOREIGN PATENT DOCUMENTS

KR        10-1818246 B1     1/2018
KR     10-2018-0062113 A    6/2018

*Primary Examiner* — Nikolay K Yushin
(74) *Attorney, Agent, or Firm* — Birch, Stewart, Kolasch & Birch, LLP

(57) ABSTRACT

An organic light-emitting diode display device can include a substrate including first, second and third sub-pixels, each of the first, second and third sub-pixels including an emission area and a non-emission area; a driving thin film transistor in the non-emission area of each of the first, second and third sub-pixels; a light-emitting diode connected to the driving thin film transistor; a polarizer at an outer surface of the substrate, the polarizer including a reflective polarizer; and a light control pattern disposed inside of the substrate and corresponding to the non-emission area, the light control pattern being configured to change a direction of light incident on the light control pattern.

20 Claims, 7 Drawing Sheets

(51) Int. Cl.
*H01L 27/32* (2006.01)
*H01L 29/786* (2006.01)

(56) References Cited

U.S. PATENT DOCUMENTS

| | | | |
|---|---|---|---|
| 9,741,286 B2 * | 8/2017 | Sakariya | G09G 3/3233 |
| 2015/0348504 A1 * | 12/2015 | Sakariya | G09G 3/3233 345/206 |

* cited by examiner

ORGANIC LIGHT-EMITTING DIODE DISPLAY DEVICE

CROSS-REFERENCE TO RELATED APPLICATION

The present application claims priority from and the benefit under 35 U.S.C § 119(a) of Korean Patent Application No. 10-2018-0142532 filed in the Republic of Korea on Nov. 19, 2018, which is hereby incorporated by reference in its entirety.

BACKGROUND OF THE INVENTION

Field of the Disclosure

The present disclosure relates to an organic light-emitting diode display device with improved light extraction efficiency.

Discussion of the Related Art

Recently, with entering into a full-fledged information age, there is a growing interest in information display dealing with and displaying mass information. In addition, as the demand to use portable information media increases, various lightweight and thin flat panel display devices corresponding to this have been developed and have been in the spotlight.

Particularly, among the various flat panel display devices, an organic light-emitting diode (OLED) display device can be lightweight and thin because it is self-luminous and does not require a backlight unit used for a liquid crystal display device which is a nonluminous device.

The OLED display device also has wide viewing angles and high contrast ratio as compared with a liquid crystal display device and has advantages in power consumption. In addition, the OLED display device is driven by low voltages of direct current (DC) and has a fast response time. Further, the OLED display device is strong against the external impacts and is used in a wide range of temperatures because its components are solids.

In addition, the contrast ratio of the OLED display device can be greatly reduced according to the intensity of the external light. To prevent this, a polarizer for blocking reflection of the external light is attached to an upper portion of a substrate through which light is emitted.

However, attaching the polarizer can prevent a decrease in the contrast ratio due to the external light but reduces the light efficiency of image data emitted from the OLED display device itself to less than half.

Therefore, it is desirable to study an OLED display device having improved efficiency of light emitted from the OLED display device to the outside while enhancing visibility by suppressing reflection of the external light.

SUMMARY OF THE INVENTION

Accordingly, the present disclosure is directed to an OLED display device that substantially obviates one or more of the problems due to limitations and disadvantages of the related art.

An object of the present disclosure is to provide an OLED display device having improved light extraction efficiency.

Another object of the present disclosure is to improve an image quality of an OLED display device.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an organic light-emitting diode display device that includes a substrate including first, second and third sub-pixels, each of the first, second and third sub-pixels including an emission area and a non-emission area; a driving thin film transistor in the non-emission area of each of the first, second and third sub-pixels; a light-emitting diode connected to the driving thin film transistor, a polarizer at an outer surface of the substrate and including a reflective polarizer; and a light control pattern inside the substrate and corresponding to the non-emission area.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate embodiments of the present disclosure and together with the description serve to explain the principles of the present disclosure. In the drawings.

DETAILED DESCRIPTION OF THE EMBODIMENTS

Reference will now be made in detail to embodiments of the disclosure, examples of which are illustrated in the accompanying drawings.

Figure 1:
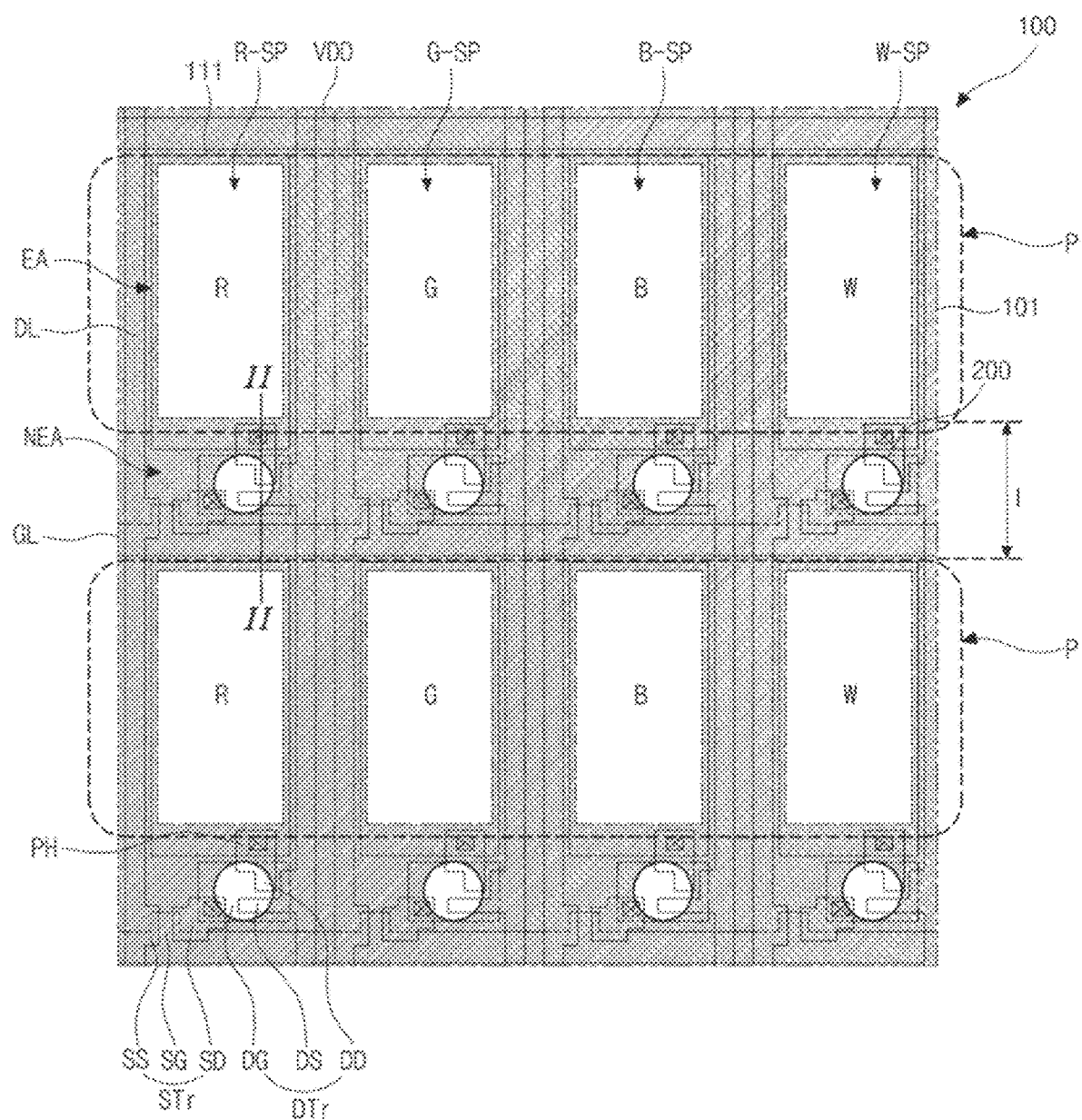
FIG. 1 is a plan view showing a plurality of sub-pixels of an OLED display device according to an embodiment of the present disclosure.
Figure 2:
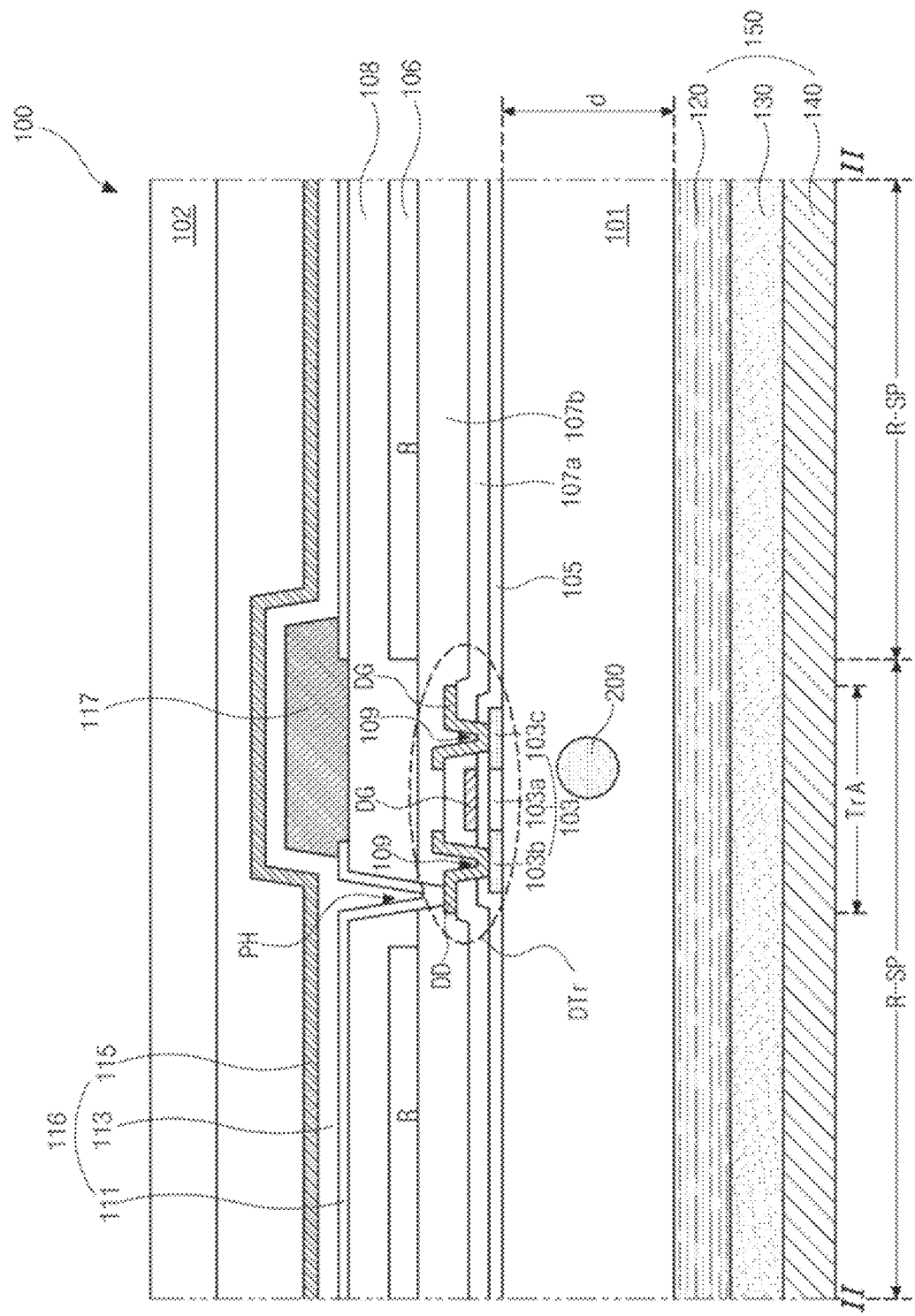
FIG. 2 is a cross-sectional view taken along the line II-II in FIG. 1 according to an embodiment of the present disclosure.

FIG. 1 is a plan view showing a plurality of sub-pixels of an OLED display device according to an embodiment of the present disclosure, and FIG. 2 is a cross-sectional view taken along the line II-II in FIG. 1.

An OLED display device 100 according to an embodiment of the present disclosure can be a top emission type or a bottom emission type according to the transmission direction of emitted light. Hereinafter, the bottom emission type OLED display device will be described as an example.

In FIG. 1, the OLED display device 100 according to the embodiment of the present disclosure includes a plurality of unit pixels P, and each unit pixel P includes red, green, and blue sub-pixels R-SP, G-SP, and B-SP. Each of the sub-pixels R-SP, G-SP and B-SP includes an emission area EA. A bank 117 is disposed along an edge of the region area EA, and a region where the bank 117 is disposed becomes a non-emission area NEA.

The red, green, and blue sub-pixels R-SP, G-SP, and B-SP can be alternately arranged in a horizontal direction, and a plurality of red, green and blue sub-pixels R-SP, G-SP, and B-SP can be arranged in a vertical direction, respectively. Namely, the sub-pixels R-SP, G-SP, and B-SP arranged in the vertical direction have the same color.

Accordingly, the red, green, and blue sub-pixels R-SP, G-SP, and B-SP are each arranged in a stripe form. Additionally, one unit pixel P can further include a white sub-pixel W-SP, and the unit pixel including red, green, blue and white sub-pixels R-SP, G-SP, B-SP and W-SP can have a rectangular structure.

Here, although the sub-pixels R-SP, G-SP, B-SP, and W-SP are shown as being positioned side by side at the same width for convenience of explanation, the sub-pixels R-SP, G-SP, B-SP, and W-SP can have various structures with different widths.

At this time, switching and driving thin film transistors STr and DTr are provided in the non-emission area NEA of each of the sub-pixels R-SP, G-SP, B-SP and W-SP, and a light-emitting diode 116 including a first electrode 11, an organic light-emitting layer 113 and a second electrode 115 is formed in the emission area EA of each of the sub-pixels R-SP, G-SP, B-SP and W-SP.

Here, the switching thin film transistor STr and the driving thin film transistor DTr are connected to each other, and the driving thin film transistor DTr is connected to the light-emitting diode 116.

More particularly, a gate line GL, a data line DL and a power supply line VDD are disposed on a substrate 101 to define the sub-pixels R-SP, G-SP, B-SP, and W-SP.

The switching thin film transistor STr is formed in a region where the gate line GL and the data ling DL cross each other, and the switching thin film transistor STr functions as selecting the sub-pixels R-SP, G-SP, B-SP, and W-SP.

This switching thin film transistor STr includes a gate electrode SG extending from the gate line GL, a semiconductor layer, a source electrode SS, and a drain electrode SD.

The driving thin film transistor DTr drives the light-emitting diodes 116 of the sub-pixels R-SP, G-SP, B-SP and W-SP selected by the switching thin film transistor STr. The driving thin film transistor DTr includes a gate electrode DG connected to the drain electrode SD of the switching thin film transistor STr, a semiconductor layer 103, a source electrode DS connected to the power supply line VDD, and a drain electrode DD.

The drain electrode DD of the driving thin film transistor DTr is connected to the first electrode 111 of the light-emitting diode 116.

An organic light-emitting layer 113 is interposed between the first electrode 111 and the second electrode 115 of the light-emitting diode 116.

Referring to FIG. 2, the semiconductor layer 103 is disposed in a switching area TrA of the non-emission area NEA of each of the sub-pixels R-SP, G-SP, B-SP and W-SP on the substrate 101. The semiconductor layer 103 is formed of silicon and has an active region 103a at a central portion and source and drain regions 103b and 103c at both sides of the active region 103a. The active region 103a becomes a channel, and the source and drain regions 103b and 103c are doped with a high concentration of impurities.

A gate insulating layer 105 is disposed on the semiconductor layer 103.

The gate line GL extending in one direction and the gate electrode DG corresponding to the active region 103a are provided on the gate insulating layer 105.

A first interlayer insulating layer 107a is disposed on the gate electrode DG and the gate line GL. The first interlayer insulating layer 107a and the gate insulating layer 105 thereunder have first and second semiconductor contact holes 109 respectively exposing the source and drain regions 103b and 103c at both sides of the active region 103a.

Next, the source and drain electrodes DS and DD are provided on the first interlayer insulating layer 107a having the first and second semiconductor contact holes 109. The source and drain electrodes DS and DD are spaced apart from each other and are in contact with the source and drain regions 103b and 103c through first and second semiconductor contact holes 109.

A second interlayer insulating layer 107b is disposed on the source and drain electrodes DS and DD and the first interlayer insulating layer 107a exposed between the source and drain electrodes DS and DD.

At this time, the source and drain electrodes DS and DD, the semiconductor layer 103 including the source and drain regions 103b and 103c contacting the source and drain electrodes DS and DD, the gate insulating layer 105 on the semiconductor layer 103, and the gate electrode DG constitute a driving thin film transistor DTr.

In addition, the switching thin film transistor STr has the same structure as the driving thin film transistor DTr and is connected to the driving thin film transistor DTr.

The switching thin film transistor STr and the driving thin film transistor DTr are exemplified as a top gate type in which the semiconductor layer 103 is formed of a polycrystalline silicon or an oxide semiconductor material. As a modified example, the switching thin film transistor STr and the driving thin film transistor DTr can be a bottom gate type in which the semiconductor layer is formed of intrinsic and impurity-doped amorphous silicon.

When the semiconductor layer 103 is formed of an oxide semiconductor material, a light-shielding layer can be further disposed under the semiconductor layer 103, and a buffer layer can be interposed between the light-shielding layer and the semiconductor layer 103.

Moreover, a wavelength conversion layer 106 is disposed on the second interlayer insulating layer 107b corresponding to the emission area EA of each of the sub-pixels R-SP, G-SP, B-SP, and W-SP. The wavelength conversion layer 106 includes a color filter which transmits only the wavelength of a color set in each of the sub-pixels R-SP, G-SP, B-SP and W-SP among the white light emitted from the light-emitting diode 116 toward the substrate 101.

That is, the wavelength conversion layer 106 can transmit only the wavelength of the red, green, or blue color.

For example, the red sub-pixel R-SP can include a red color filter, the green sub-pixel G-SP can include a green color filter, and the blue sub-pixel B-SP can include a blue color filter. At this time, a wavelength conversion layer is not provided in the white sub-pixel W-SP.

The wavelength conversion layer 106 according to another example can include quantum dots having a size emitting light of the color set in each of the sub-pixels R-SP, G-SP, B-SP and W-SP by re-emitting light according to the white light emitted from the light-emitting diode 116 toward the substrate 101. Here, the quantum dots can be selected from CdS, CdSe, CdTe, ZnS, ZnSe, GaAs, GaP, GaAs—P, Ga—Sb, InAs, InP, InSb, AlAs, AlP or AlSb, but is not limited thereto.

For example, the wavelength conversion layer 106 of the red sub-pixel R-SP can include quantum dots of CdSe or InP, the wavelength conversion layer 106 of the green sub-pixel G-SP can include quantum dots of CdZnSeS, and the wavelength conversion layer 106 of the blue sub-pixel B-SP can include quantum dots of ZnSe. As described above, the OLED display device 100 having the wavelength conversion layer 106 including the quantum dots can have a wide color gamut.

The wavelength conversion layer 106 according to another example can be formed of a color filter containing quantum dots.

Accordingly, the OLED display device 100 of the present disclosure emits R. G. B, and W colors for respective sub-pixels R-SP, G-SP, B-SP, and W-SP and displays full colors of high luminance.

An overcoat layer 108 is disposed on the wavelength conversion layer 106. The overcoat layer 108 has a drain contact hole PH exposing the drain electrode DD with the second interlayer insulating layer 107b. The first electrode 111 is disposed on the overcoat layer 108 and is connected to the drain electrode DD of the driving thin film transistor DTr. The first electrode 111 is formed of a material having a relatively high work function value and functions as an anode of the light-emitting diode 116.

The first electrode 111 can be formed of a metal oxide such as indium tin oxide (ITO) or indium zinc oxide (IZO), a mixture of metal and oxide such as ZnO:Al or SnO2:Sb, or a conductive polymer such as poly(3-methylthiophene), poly[3,4-(ethylene-1,2-dioxy)thiophene](PEDT), polypyrrole or polyaniline. In addition, the first electrode 111 can be formed of a carbon nanotube (CNT), a graphene, a silver nano wire, or the like.

The first electrode 111 is positioned for each of the sub-pixels R-SP, G-SP, B-SP, and W-SP, and the bank 117 is positioned between adjacent first electrodes 111. That is, the first electrodes 111 for the respective sub-pixels R-SP, G-SP, B-SP and W-SP are separated from each other by using the bank 117 as a boundary for the sub-pixels R-SP, G-SP, B-SP and W-SP.

The organic light-emitting layer 113 is disposed on the first electrode 111. The organic light-emitting layer 113 can be a single layer formed of a luminous material and can be a multiple layer including a hole injection layer, a hole transport layer, an emitting material layer, an electron transport layer, and an electron injection layer for increasing the luminous efficiency.

A second electrode 115, which functions as a cathode, is disposed on a substantially entire surface of the organic light-emitting layer 113.

The second electrode 115 can be formed of a material having a relatively low work function value. At this time, the second electrode 15 can be a single layer of an alloy composed of a first metal such as silver (Ag) or the like having relatively low work function metal and a second metal such as magnesium (Mg) or the like at a predetermined ratio. Alternatively, the second electrode 115 can be a double layer or a multiple layer.

In the OLED display device 100, when a predetermined voltage is applied to the first electrode 111 and the second electrode 115 according to a selected signal, a hole injected from the first electrode 111 and an electron provided from the second electrode 115 are transported to the organic light-emitting layer 113 to form an exciton. Then, when the exciton transitions from the excited state to the ground state, white light is generated and emitted to the outside.

At this time, the emitted light passes through the transparent first electrode 111 and then is converted into R. G. B. and W colors while passing through the wavelength conversion layer 106 for each of the sub-pixels R-SP, G-SP, B-SP and W-SP, so that the full colors of high luminance are output to the outside and the OLED display device 100 implements an arbitrary image.

A protective film 102 in the form of a thin film is formed on the driving thin film transistor DTr and the light-emitting diode 116 so that the OLED display device 100 is encapsulated through the protective film 102.

Here, in order to prevent external oxygen and moisture from penetrating into the OLED display device 100, at least two inorganic protective films are laminated and used for the protective film 102. At this time, it is preferable that an organic protective film is interposed between the two inorganic protective films in order to compensate for the impact resistance of the inorganic protective film.

In the structure in which the organic protective film and the inorganic protective film are alternately repeated and laminated, it is preferable that the inorganic protective film completely covers the organic protective film because it is desirable to prevent penetration of moisture and oxygen through a side surface of the organic protective film.

Accordingly, the OLED display device 100 can prevent moisture and oxygen from penetrating into the inside from the outside.

As a result, oxidation and corrosion of the electrode layer can be prevented from occurring due to oxygen or moisture introduced into the inside, and problems can be prevented that luminescent characteristics of the organic light-emitting layer 113 are decreased and the lifetime of the organic light-emitting layer 113 is shortened.

Further, it is possible to prevent current leakage and short circuit from occurring, and it is possible to prevent a pixel defect from occurring. Therefore, it is possible to prevent the problems of unevenness in luminance and image characteristics.

Here, the OLED display device 100 according to the embodiment of the present disclosure includes a polarizer 150 on the outer surface of the substrate 101 of the OLED display device 100 through which light is transmitted in order to prevent the contrast ratio from being lowered due to external light.

That is, the OLED display device 100 improves the contrast ratio by disposing the polarizer 150 that blocks the external light incident from the outside in the transmission direction of the light emitted from the organic light-emitting layer 113 during the driving mode for realizing an image.

The polarizer 150 can be a circular polarizer for shielding the external light and can include a retarder 130 attached to the outer surface of the substrate 101, a linear polarizer 140 and a reflective polarizer 120. The linear polarizer 140, the retarder 130, and the reflective polarizer 120, beneficially, are stacked in such a manner that the linear polarizer 140 is positioned to be close to the incident direction of the external light, the retarder 130 is positioned between the substrate 101 and the linear polarizer 140, and the reflective polarizer 120 is positioned between the substrate 101 and the retarder 130. Namely, the reflective polarizer 120, the retarder 130 and the linear polarizer 140 are sequentially arranged toward the outside from the substrate 101.

The linear polarizer 140 includes a polarizing layer changing the polarization characteristics of light and first and second TAC films located at both sides of the polarizing layer to protect and support the polarizing layer.

The linear polarizer 140 absorbs linearly polarized light parallel to the absorption axis of the polarizing layer and transmits linearly polarized light perpendicular to the absorption axis, that is, linearly polarized light parallel to the transmission axis.

The polarizing layer can be formed of polyvinyl alcohol (PVA) dyed with iodine ions or dichroic dyes and then stretched. Alternatively, the polarizing layer can be formed of a reactive mesogen (RM) and a dichroic dye, and the polarizing layer can further include an alignment layer for aligning the reactive mesogens and dichroic dyes.

The retarder 130 can be a quarter wave plate (QWP) that has phase retardation of $\lambda/4$ and changes the polarization state of incident light. When linearly polarized light is introduced in a direction of the transmission axis of the linear polarizer 140, the retarder 130 can be arranged such that the linearly polarized light is changed into right-circularly polarized light after passing through the retarder 130.

The reflective polarizer 120, which is positioned on the retarder 130 and is in close contact with the substrate 101 of the OLED display device 100, passes light that is parallel to its polarization axis and reflects light that is not parallel to the polarization axis. The polarization axis of the reflective polarizer 120 is parallel to the transmission axis of the linear polarizer 140, and light transmitted through the reflective polarizer 120 passes through the retarder 130 and the linear polarizer 140.

At this time, some of light emitted from the OLED display device 100 that does not coincide with the polarization axis of the reflective polarizer 120 is reflected by the reflective polarizer 120 and is incident on the second electrode 115 of the light-emitting diode 116 formed in the OLED display device 100, and then the light is reflected back toward the outside, thereby causing phase retardation.

As a result, while light is recycled between the reflective polarizer 120 and the second electrode 115, some of the light passes through the reflective polarizer 120, and the other of the light is re-reflected. These processes are repeated. Finally, light emitted from the OLED display device 100 coincides with the polarization axis of the reflective polarizer 120 and is output to the outside.

As described above, the amount of light emitted from the light-emitting diode 116 of the OLED display device 100 can be further increased by disposing the reflective polarizer 120 on the polarizer 150 including the linear polarizer 140 and the retarder 130.

For example, when the polarizer 150 includes only the linear polarizer 140 and the retarder 130, the amount of light emitted from the OLED display device 100 is reduced by at least 50% and is output. However, in the embodiment of the present disclosure, the lost 50% light can be used again as reflected light. Therefore, when the amount of light self-emitted in the OLED display device 100 is 100%, at least 75% of light can be emitted by further securing about 25% to about 30% of light in the embodiment of the present disclosure while less than 50% of light is emitted in the related art.

In addition, when the light is recycled by the reflective polarizer 120, some of the reflected light reaches the adjacent sub-pixels R-SP, G-SP, B-SP, and W-SP emitting different colors. The lights emitted from the adjacent sub-pixels R-SP, G-SP, B-SP, and W-SP are mixed with each other to cause blurring phenomenon and ghosting phenomenon.

The blurring phenomenon and the ghosting phenomenon can cause light leakage, and the image quality of the OLED display device 100 is lowered. Particularly, the blurring phenomenon and the ghosting phenomenon cause a variation in brightness according to viewing angles, and thus the image quality of the OLED display device 100 is further lowered.

The blurring phenomenon and the ghost phenomenon occur in the process of reflecting light in the vicinity of the switching and driving thin film transistors STr and DTr where a plurality of electrodes or lines formed of a metal material are located. Therefore, in the OLED display device 100 according to the embodiment of the present disclosure in which the red, green, blue and white sub-pixels R-SP, G-SP, B-SP and W-SP are alternately arranged in each row along the horizontal direction and the same color sub-pixels R-SP, G-SP, B-SP and W-SP are arranged in each column along the vertical direction in the context of the figure, a light control pattern 200 is formed inside the substrate 101 made of glass corresponding to the non-emission area NEA which is disposed between adjacent sub-pixel rows and in which the switching and driving thin film transistors STr and DTr are formed.

The light control pattern 200 located inside the substrate 101 minimizes light reaching the adjacent sub-pixels R-SP, G-SP, B-SP and W-SP emitting different colors in the process of recycling the light. In other words, the light control pattern 200 can help redirect light away from an adjacent sub-pixel and out of the OLED display device 100, rather than traveling towards an adjacent sub-pixel or remaining trapping inside the substrate.

Therefore, the blurring phenomenon and the ghost phenomenon can be prevented from occurring due to the light reflected from the adjacent sub-pixels R-SP, G-SP, B-SP, and W-SP.

As a result, the image quality of the OLED display device 100 can be improved, and the light extraction efficiency of the OLED display device 100 can be further improved by re-reflecting or redirecting the light reflected from the adjacent sub-pixels R-SP, G-SP, B-SP, and W-SP and extracting the light to the outside.

Figure 3A:
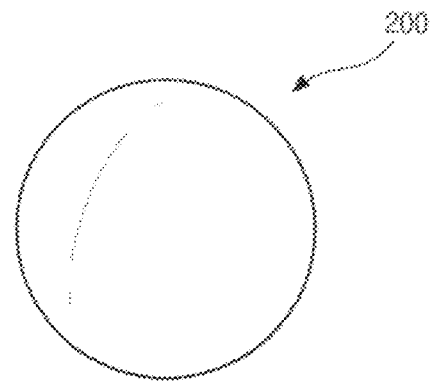
FIGS. 3A to 3C are views showing shapes of a light control pattern according to embodiments of the present disclosure.
Figure 3B:
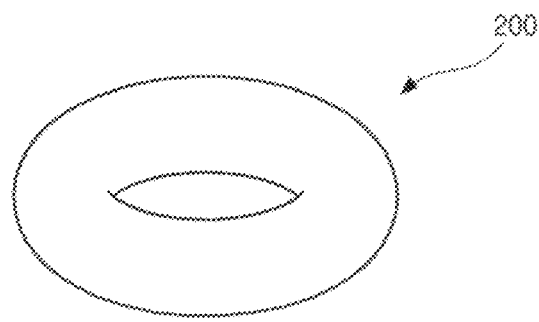
Figure 3C:
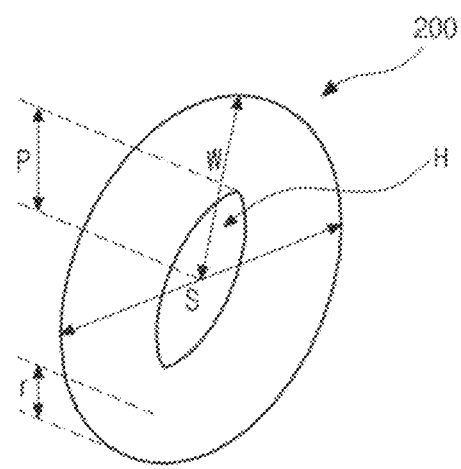
Figure 4A:
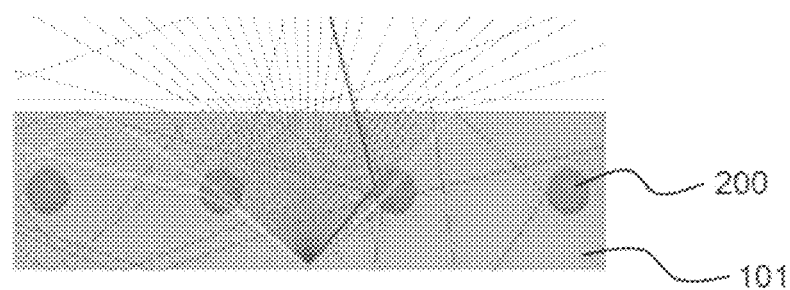
FIG. 4A is a simulation result showing a path of light passing through a substrate with a spherical light control pattern according to an embodiment of the present disclosure.
Figure 4B:
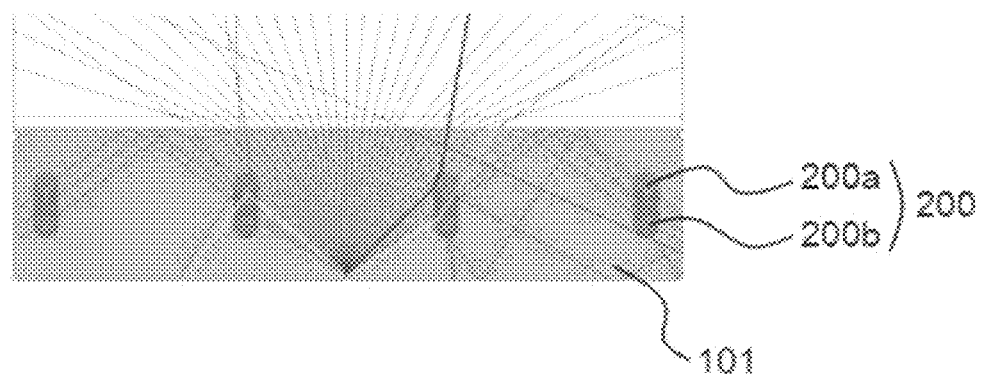
FIG. 4B is a simulation result showing a path of light passing through a substrate with a donut-shaped light control pattern standing upright parallel to a thickness direction of the substrate according to an embodiment of the present disclosure.

FIGS. 3A to 3C are views showing various shapes of a light control pattern according to embodiments of the present disclosure. FIG. 4A is a simulation result showing a path of light passing through a substrate with a spherical light control pattern, and FIG. 4B is a simulation result showing a path of light passing through a substrate with a donut-shaped light control pattern standing upright parallel to a thickness direction of the substrate.

The light control pattern 200 located inside the substrate 101 made of glass can have a spherical shape as shown in FIG. 3A. Alternatively, the light control pattern 200 can have a ring shape or a donut shape as shown in FIGS. 3B and 3C (hereinafter, referred to as a "donut shape").

The donut-shaped light control pattern 200 can be configured to be laid down perpendicularly to a direction of the thickness d of the substrate 101 of FIG. 2 as shown in FIG.

3B or configured to be upright in parallel to the direction of the thickness d of the substrate 101 of FIG. 2.

The donut-shaped light control pattern 200 has a circular cross-section with a hole H provided therein.

The light control pattern 200 can be formed by changing the density of the inside of the substrate 101 made of glass using the energy of the laser beam concentrated at a high density. Here, the donut-shaped light control pattern 200, which is formed upright in parallel to the thickness direction of the substrate 101, can be arranged such that its long axis is disposed in parallel to the horizontal direction or in parallel to the vertical direction corresponding to the non-emission area NEA which is disposed between adjacent sub-pixel rows and in which the switching and driving thin film transistors STr and DTr are formed, in which the red, green, blue and white sub-pixels R-SP, G-SP, B-SP and W-SP are alternately arranged in each row along the horizontal direction and the same color sub-pixels R-SP, G-SP, B-SP and W-SP are arranged in each column along the vertical direction in the context of the figure.

Figure 3D:
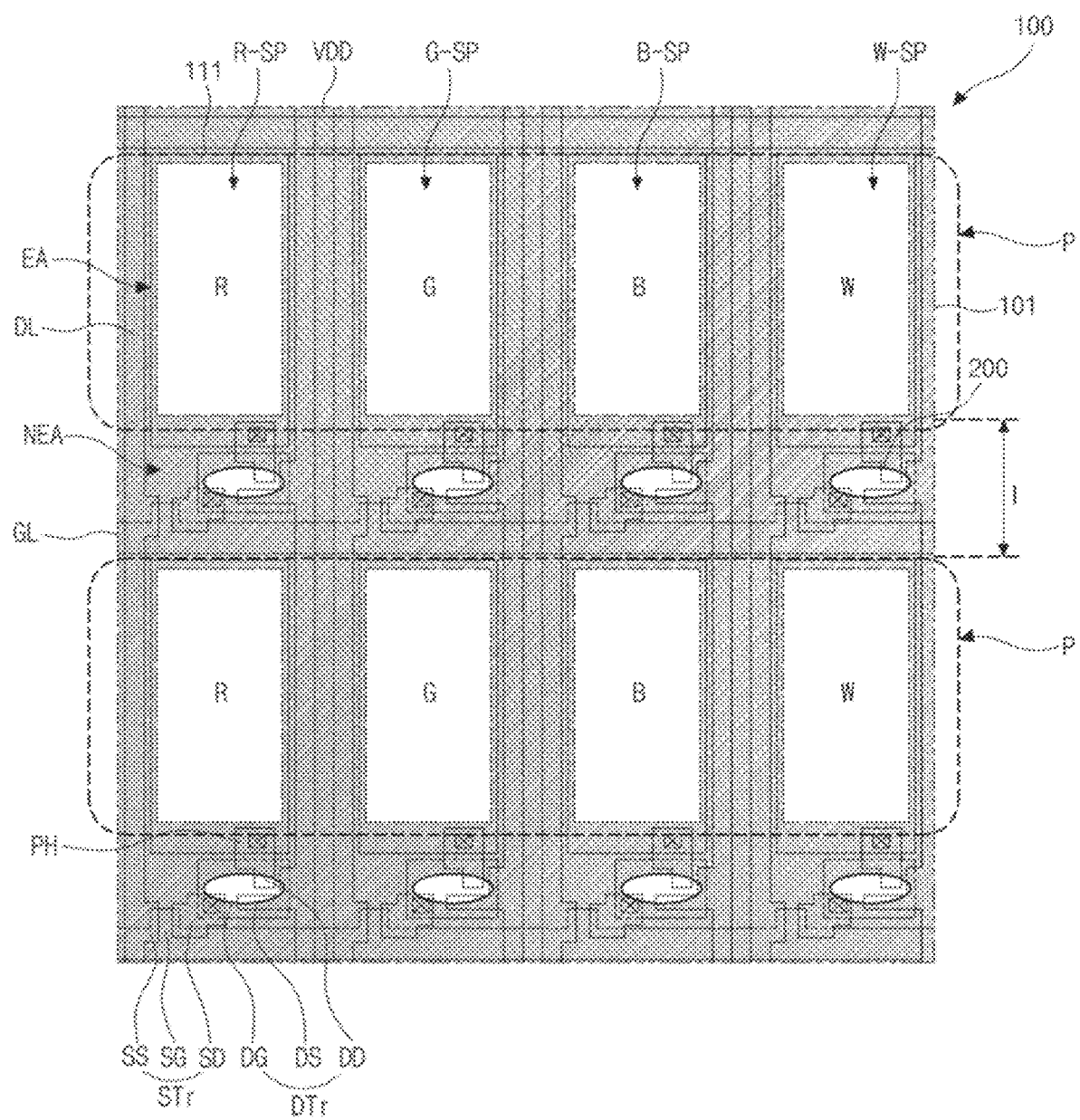
FIG. 3D is a plan view showing a plurality of sub-pixels of an OLED display device according to another embodiment of the present disclosure.

At this time, in order to minimize that light reflected in the vicinity of the switching and driving thin film transistors STr and DTr between the rows of the sub-pixels R-SP, G-SP, B-SP and W-SP reaches the adjacent sub-pixels R-SP, G-SP, B-SP and W-SP emitting different colors, as shown in FIG. 3D, it is more preferable to dispose the donut-shaped light control pattern 200 such that the long axis is parallel to the horizontal direction.

That is, the light control pattern 200 can be obtained by concentrating the laser beam inside the substrate 101 made of glass and internally patterning the substrate 101. The laser used for the internal patterning is an ultra-short pulse laser, which changes the density inside the glass and generates an empty space, that is, induces a cavitation phenomenon inside the glass, thereby forming a pattern. This causes heterogeneity between the refractive index of the pattern and the refractive index of the glass itself. In other words, a laser can be used to strategically place bubbles at precise locations within the substrate layer, and these bubbles can help change the direction of sideways traveling light or light that would otherwise hit a surface of the substrate at or beyond a critical angle of the substrate, into a vertical direction out of the display device.

This optically inhomogeneous portion is recognized as the light control pattern 200 by visual confirmation or optoelectronic detection.

The size (e.g., diameter) S of the light control pattern 200 can depend on the concentrated state of the laser beam or the amount of energy of the laser beam. It is preferable that the light control pattern 200 according to the embodiment of the present disclosure is formed to have the size S less than half the thickness d of FIG. 2 of the substrate 101 made of glass within a range of the width I of the non-emission area NEA of FIG. 1.

Namely, the light control pattern 200 is disposed in a central portion of the substrate 101 of FIG. 2 along the thickness direction. Here, the light control pattern 200, beneficially, is positioned to correspond to the non-emission area NEA of FIG. 1 between the rows of the sub-pixels R-SP, G-SP, B-SP and W-SP such that the size S of the light control pattern 200 does not exceed the width I of FIG. 1 of the non-emission area NEA of FIG. 1, thereby preventing the light control pattern 200 from being visible to the outside.

In addition, the light control pattern 200 has the size S less than half the thickness d of the substrate 101 of FIG. 2 made of glass, and it is desirable to prevent the problem that the rigidity of the substrate 101 is weakened as the size S of the light control pattern 200 increases (e.g., if the light control patterns are made too large, then they can create a type of perforated grid throughout the substrate unduly weakening it).

Here, it is preferable that the light control pattern 200 is formed to have the size S less than half the thickness d of the substrate 101 of FIG. 2, more preferably 30% or less of the thickness d of substrate 101 of FIG. 2.

For example, when the thickness d of the substrate 101 of FIG. 2 is 700 µm, the light control pattern 200 can be formed to have the size S of 180 to 220 µm.

In addition, the light control pattern 200 can be arranged in a double line along the direction of the thickness d of the substrate 101 of FIG. 2 within a range of the size S less than half the thickness d of the substrate 101 of FIG. 2 or can be arranged in a double line perpendicularly to the direction of the thickness d of the substrate 101 of FIG. 2 within a range of the width I of the non-emission area NEA of FIG. 1.

Further, a plurality of light control patterns 200 are disposed and spaced apart from each other with a regular interval along the non-emission area NEA of FIG. 1 between the rows of the sub-pixels R-SP, G-SP, B-SP and W-SP of FIG. 1. Also, it is desirable that each light control pattern 200 is positioned to correspond to the center of each of the sub-pixels R-SP, G-SP, B-SP, and W-SP of FIG. 1.

Accordingly, the light control patterns 200 are positioned between the sub-pixels R-SP. G-SP, B-SP. W-SP of FIG. 1 along one row and the sub-pixels R-SP, G-SP, B-SP, and W-SP of FIG. 1 along another row adjacent to the one row, thereby minimizing the light that reaches into the corresponding adjacent sub-pixels R-SP, G-SP, B-SP and W-SP.

Alternatively, each light control pattern 200 can be disposed corresponding to the center of each unit pixel P of FIG. 1 including the red, green, blue and white sub-pixels R-SP, G-SP, B-SP and W-SP.

Table 1 below shows the simulation results of the luminance and the reflectance according to the presence or absence of the light control pattern 200 and the shape of the light control pattern 200 according to the embodiment of the present disclosure.

TABLE 1

|  | Luminance (0°) | Reflectance |
| --- | --- | --- |
| Sample 1 | 100% | 57% |
| Sample 2 | 128% | 47% |
| Sample 3 | 135% | 38% |

Prior to the description, Sample 1 represents a related art OLED display device in which a light control pattern is not provided inside the substrate. Sample 2 represents a structure in which a spherical light control pattern 200 is formed inside the substrate 101 according to the embodiment of the present disclosure, and Sample 3 represents a structure in which a donut-shaped light control pattern 200 is formed uprightly in parallel with the thickness d of the substrate 101 of FIG. 2 inside the substrate 101 according to the embodiment of the present disclosure.

Here, the luminance is the result of measuring the luminance of the light emitted to the front side, that is, is measured at 0 degrees, and the reflectance is the result of measuring the amount of light reaching the neighboring sub-pixels R-SP, G-SP, B-SP and W-SP.

Referring to Table 1, when the luminance of the related art OLED display device, that is, a configuration in which a light control pattern is not provided, is defined as 100%, it is understood that the luminance is increased by 128 to 135% or more in the situation of providing the light control pattern 200 formed inside the substrate 101 according to the embodiment of the present disclosure.

Further, it can be seen that the amount of light reaching the neighboring sub-pixels R-SP, G-SP, B-SP and W-SP of FIG. 1 is also remarkably reduced.

That is, in the OLED display device 100 of FIG. 1 including the reflective polarizer 120 of FIG. 2, by forming the light control pattern 200 inside the substrate 101 through which the light of the OLED display device 100 of FIG. 1 is output to the outside, the luminance can be further improved. In addition, the arrival of light to the neighboring sub-pixels R-SP, G-SP, B-SP and W-SP of FIG. 1 can be minimized, and it is possible to prevent the blurring phenomenon and the ghosting phenomenon from occurring due to the mixture of the light emitted from the adjacent sub-pixels R-SP, G-SP, B-SP, and W-SP.

In addition, it can be seen from the above Table 1 that Sample 3 having a donut-shaped light control pattern 200 is more effective in luminance and the reflectance than Sample 2 having the spherical light control pattern 200. It can be confirmed that a larger amount of light is refracted and reflected to the front side in the situation where the donut-shaped light control pattern 200 is located inside the substrate 101 as shown in FIG. 4B than in the situation where the spherical light control pattern 200 is located inside the substrate 101 as shown in FIG. 4A.

The donut-shaped light control pattern 200 standing upright in parallel with the thickness d of the substrate 101 of FIG. 2 is divided into an upper ring region 200a and a lower ring region 200b by a donut shape, and thus the light is doubly refracted and reflected, so that more light is guided to the front side or it is at least minimized from reaching to the neighboring sub-pixel area.

This has a similar effect to the situation that the spherical light control patterns 200 are arranged in a double line along the thickness direction of the substrate 101 (e.g., two bubbles or two light control patterns overlapping with each other in the thickness/vertical direction of the substrate).

It is preferable that the donut-shaped light control pattern 200 is formed such that its maximum radius W is twice the radius P of the hole H and the curvature r of the light control pattern 200 is a half of the radius P of the hole H.

For example, when the radius W of the light control pattern 200 is 100 μm, the radius P of the hole H is 50 μm, and the curvature r of the light control pattern 200 is 25 μm.

Accordingly, when the donut-shaped light control pattern 200 is positioned upright in parallel with the thickness direction of the substrate 101, the donut-shaped light control pattern 200 is defined as the upper ring region 200a and the lower ring region 200b, and it is possible to obtain the same effect as that of the spherical light control patterns 200 arranged in a double line (e.g., one line of bubbles stacked above another line of bubbles).

As described above, since one donut-shaped light control pattern 200 realizes the same effect as that two spherical light control patterns 200 are provided, only one donut-shaped light control pattern 200 can be formed inside the substrate 101, whereby the process of forming the light control pattern 200 can be simplified and the efficiency of the process can be improved.

Figure 5A:
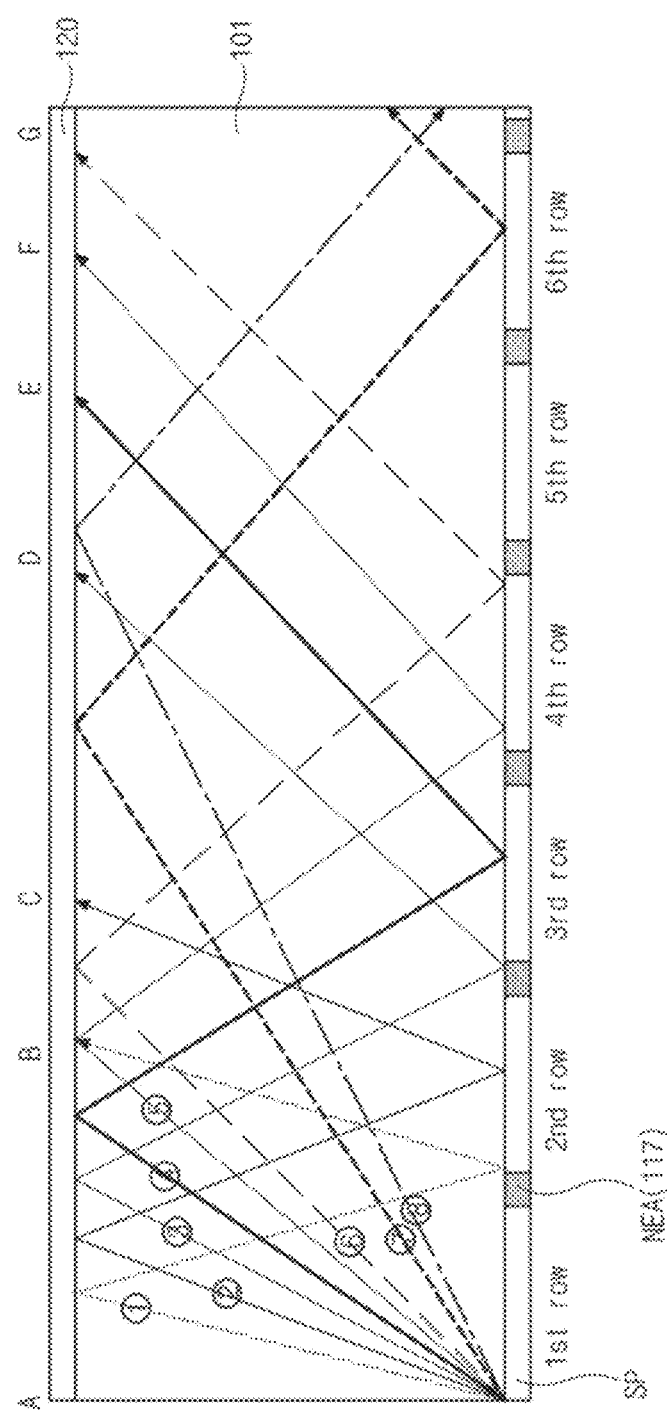
FIG. 5A is a schematic view illustrating a path of light in an OLED display device without a light control pattern.
Figure 5B:
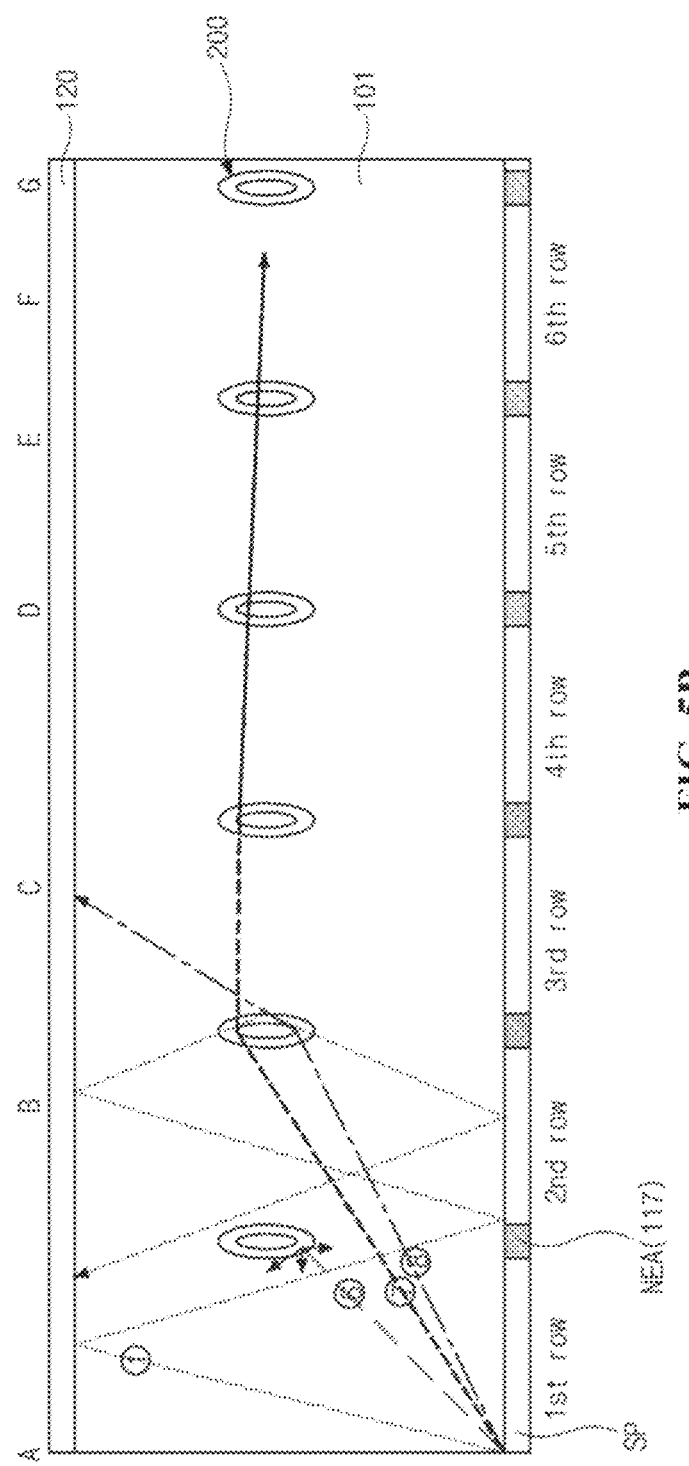
FIG. 5B is a schematic view illustrating a path of light in an OLED display device including a substrate having a donut-shaped light control pattern according to the embodiment of the present disclosure.

FIG. 5A is a schematic view illustrating a path of light in an OLED display device without a light control pattern, and FIG. 5B is a schematic view illustrating a path of light in an OLED display device including a substrate having a donut-shaped light control pattern according to the embodiment of the present disclosure.

In FIG. 5A, the light emitted from the sub-pixel SP located in the first row is emitted to the front side of the sub-pixel SP to realize the image A to be implemented. However, some of the light emitted from the sub-pixel SP is reflected by the reflective polarizer 120 and then re-reflected with tilted at an angle of certain degrees in the OLED display device of FIG. 1. At this time, the light ① reflected by the reflective polarizer 120 and then re-reflected with tilted at an angle of 20° in the OLED display device of FIG. 1 forms a 20° ghost image B.

In addition, after being reflected by the reflective polarizer 120, the light ② re-reflected with tilted at an angle of 30° or the lights ③, ④, ⑤ and ⑥ re-reflected with tilted at angles of 45°, 55°, 65° and 78° in the OLED display device of FIG. 1 form ghost images C, D, E, F and G in the adjacent sub-pixels SP instead of the actual images to be implemented.

The ghost images B, C, D, E, F, and G are formed in the sub-pixels SP located from the first row to the sixth row. The lights ⑦ and ⑧ re-reflected with tilted at angles of 88° and 95° form ghost images beyond the sub-pixel SP located in the sixth row.

This lowers the image quality of the OLED display device 100 of FIG. 1.

In contrast, referring to FIG. 5B, the light ① emitted from the sub-pixel SP in the first row, reflected by the reflective polarizer 120 and then re-reflected with tilted at an angle of 20° in the OLED display device 100 of FIG. 1 is totally reflected by the light control pattern 200 and is emitted in the same sub-pixel SP, so that no ghost image is formed.

Further, the light ⑥ re-reflected with tilted at an angle of 78° is transmitted and scattered by the light control pattern 200 and is blocked without reaching the neighboring sub-pixel SP. Even if the lights ⑦ and ⑧ re-reflected with tilted at angles of 88° and 95° reach the neighboring sub-pixels SP, the lights ⑦ and ⑧ are totally reflected or transmitted and scattered by the light control pattern 200, and the amount of light reaching the neighboring sub-pixels SP is minimized.

Accordingly, it is possible to minimize the arrival of light in the adjacent sub-pixels SP which are provided in other rows and emit different colors. As a result, the blurring phenomenon and the ghosting phenomenon can be prevented from occurring, and the image quality of the OLED display device 100 of FIG. 1 can be improved.

As described above, the OLED display device 100 of FIG. 1 according to the embodiment of the present disclosure includes the polarizer 150 of FIG. 2 provided with the reflective polarizer 120 attached to the outer surface of the substrate 101 for minimizing external light reflection and improving light extraction efficiency, and the light control pattern 200 is formed inside the substrate 101. Therefore, in the process of reflecting light by the reflective polarizer 120, the light can be blocked from reaching the adjacent sub-pixels SP.

Accordingly, the blurring phenomenon and the ghosting phenomenon can be prevented from occurring due to the light reflected from the adjacent sub-pixel SP, and the light reflected from the adjacent sub-pixel SP is reflected again to be extracted to the outside. Thus, the light extraction efficiency of the OLED display device 100 of FIG. 1 is further improved.

In other words, while the OLED display device 100 of FIG. 1 according to the embodiment of the present disclosure can prevent the contrast ratio from being lowered by the polarizer 150 of FIG. 2, the OLED display device 100 of FIG. 1 according to the embodiment of the present disclosure also can improve the light extraction efficiency by the reflective polarizer 120 and can prevent the blurring and ghosting phenomena from occurring as well.

Thus, the image quality of the OLED display device 100 of FIG. 1 can be significantly improved through this.

In addition, the light reflected and generated from the adjacent sub-pixel SP can be extracted to the outside, thereby further improving the light extraction efficiency.

In the above description, it is described as an example that the light control pattern 200 located inside the substrate 101 corresponds to the non-emission area NEA which is disposed between adjacent rows in each of which red, green, blue, and white sub-pixels SP are repeatedly arranged and in which the switching and driving thin film transistors STr and DTr of FIG. 1 are formed. However, the light control pattern 200 can be disposed between adjacent two of the red, green, blue and white sub-pixels arranged in the horizontal direction.

It will be apparent to those skilled in the art that various modifications and variations can be made in a display device of the present disclosure without departing from the sprit or scope of the embodiments. Thus, it is intended that the present disclosure covers the modifications and variations of this invention provided they come within the scope of the appended claims and their equivalents.

What is claimed is:

1. An organic light-emitting diode display device comprising:
   a substrate including first, second and third sub-pixels, each of the first, second and third sub-pixels including an emission area and a non-emission area;
   a driving thin film transistor in the non-emission area of each of the first, second and third sub-pixels;
   a light-emitting diode connected to the driving thin film transistor;
   a polarizer at an outer surface of the substrate, and including a reflective polarizer; and
   a light control pattern disposed inside of the substrate and corresponding to the non-emission area, the light control pattern being configured to change a direction of light incident on the light control pattern,
   wherein the light control pattern is disposed between two adjacent sub-pixels among the first, second and third sub-pixels.

2. The organic light-emitting diode display device of claim 1, wherein the light control pattern includes a bubble within the substrate.

3. The organic light-emitting diode display device of claim 1, wherein the substrate and the light control pattern have different refractive indexes.

4. The organic light-emitting diode display device of claim 1, wherein the polarizer further includes a linear polarizer and a retarder, and the reflective polarizer, the retarder and the linear polarizer are sequentially disposed on the outer surface of the substrate.

5. The organic light-emitting diode display device of claim 1, wherein the light control pattern has an oval shape.

6. The organic light-emitting diode display device of claim 1, wherein the light control pattern is configured to change a path of light emitted one of the first, second and third sub-pixels to hit a surface of the substrate with an angle of incidence less than a critical angle of the substrate.

7. The organic light-emitting diode display device of claim 1, wherein the light control pattern is configured to block light emitted from one of the first, second and third sub-pixels from reaching an adjacent sub-pixel among the first, second and third sub-pixels.

8. The organic light-emitting diode display device of claim 1, wherein a bank is formed in the non-emission area over the substrate, and the light control pattern overlaps the bank.

9. The organic light-emitting diode display device of claim 1, wherein the substrate is formed of glass, and the light control pattern is formed by changing a density inside the substrate and inducing a cavitation phenomenon to form a light refraction and scattering pattern.

10. The organic light-emitting diode display device of claim 9, wherein the substrate has a refractive index of 1.51 and the light control pattern has a refractive index of 1.0.

11. The organic light-emitting diode display device of claim 1, wherein the light control pattern has a spherical cross-section or a donut shape with a hole therein.

12. The organic light-emitting diode display device of claim 11, wherein the light control pattern is disposed with a long axis of the donut shape being parallel to a horizontal direction in which the first, second and third sub-pixels are sequentially arranged.

13. The organic light-emitting diode display device of claim 1, wherein the light control pattern is disposed to overlap with the driving thin film transistor.

14. The organic light-emitting diode display device of claim 13, wherein the light control pattern in each of the first, second and third sub-pixels corresponds to a central portion of each of the first, second and third sub-pixels and is located in the non-emission area where the driving thin film transistor of each of the first, second and third sub-pixels is formed.

15. The organic light-emitting diode display device of claim 14, wherein a diameter of the light control pattern is less than a width of the non-emission area.

16. The organic light-emitting diode display device of claim 15, wherein the diameter of the light control pattern is 30% or less of a thickness of the substrate.

17. The organic light-emitting diode display device of claim 15, wherein a maximum radius of the light control pattern is twice a radius of the hole in the doughnut shape, and a curvature of the light control pattern is a half the radius of the hole.

18. A display device comprising:
    a plurality of sub-pixels disposed on a substrate;
    a reflective polarizer disposed on the substrate; and
    a plurality of light control patterns disposed inside of the substrate,
    wherein each of the plurality of light control patterns has a first refractive index and the substrate has a second refractive index different from the first refractive index, and
    wherein each of the plurality of light control patterns is disposed between two adjacent sub-pixels among the plurality of sub-pixels.

19. The display device of claim 18, wherein each of the plurality of light control patterns has a donut shape including a long side disposed perpendicular to a surface of the substrate.

20. A display device comprising:
    a plurality of sub-pixels disposed on a substrate;
    a reflective polarizer disposed on the substrate; and
    a plurality of light control patterns disposed inside of the substrate, wherein each of the plurality of light control patterns has a first refractive index and the substrate has a second refractive index different from the first refractive index, wherein the plurality of light control patterns are arranged in a grid, and wherein each of the plurality of light control patterns is disposed between two adjacent sub-pixels among the plurality of sub-pixels.

* * * * *